United States Patent
Lashkari et al.

(10) Patent No.: US 9,667,803 B2
(45) Date of Patent: May 30, 2017

(54) NONLINEAR ACOUSTIC ECHO CANCELLATION BASED ON TRANSDUCER IMPEDANCE

(71) Applicant: Cirrus Logic International Semiconductor Ltd., Edinburgh (GB)

(72) Inventors: Khosrow Lashkari, Palo Alto, CA (US); Justin Allen, Mesa, AZ (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/852,281

(22) Filed: Sep. 11, 2015

(65) Prior Publication Data

US 2017/0078489 A1    Mar. 16, 2017

(51) Int. Cl.
*H04R 29/00* (2006.01)
*H04M 9/08* (2006.01)
(Continued)

(52) U.S. Cl.
CPC .......... *H04M 9/082* (2013.01); *G01R 27/08* (2013.01); *G10L 21/0208* (2013.01);
(Continued)

(58) Field of Classification Search
CPC ........ H04R 2400/01; H04R 3/02; H04R 5/04; H04R 1/1041; H04R 27/00; H04R 29/001; H04R 3/08; H04R 5/033; H04R 1/1091; H04R 2225/55; H04R 2460/01; H04R 2499/11; H04R 25/453; H04R 25/505; H04R 25/554; H04R 25/558; H04R 25/652
(Continued)

(56) References Cited

U.S. PATENT DOCUMENTS

| | | | | |
|---|---|---|---|---|
| 7,912,211 B1* | 3/2011 | Lambert | | H04M 9/085 379/406.08 |
| 8,204,210 B2* | 6/2012 | van de Laar | | H04M 9/082 379/406.1 |

(Continued)

FOREIGN PATENT DOCUMENTS

| | | |
|---|---|---|
| EP | 2375778 A2 | 10/2011 |
| WO | 9626592 A1 | 8/1996 |
| WO | 9626624 A1 | 8/1996 |

*Primary Examiner* — Akelaw Teshale
(74) *Attorney, Agent, or Firm* — Norton Rose Fulbright US LLP

(57) ABSTRACT

An acoustic echo cancellation (AEC) system within an audio playback system of an electronic device, such as a mobile phone, may calculate an estimation of an acoustic echo based on parameters describing the transducer reproducing the audio playback signals. Those parameters may include, for example, a resistance and/or inductance of the transducer and a current through and/or a voltage across the transducer. The acoustic echo cancellation system may predict, for example, a coil velocity of the transducer based on the transducer impedance. Then, an echo may be estimated using the predicted coil velocity. That estimated echo may be output to the transducer to cancel echo in the playback signal. Additionally, that estimated echo may be used to predict nonlinearities in the transducer output and an appropriate signal generated to cancel nonlinear behavior.

25 Claims, 8 Drawing Sheets

(51) Int. Cl.
*H04M 1/60* (2006.01)
*H04R 3/02* (2006.01)
*G01R 27/08* (2006.01)
*G10L 21/0208* (2013.01)

(52) U.S. Cl.
CPC ............ *H04M 1/6041* (2013.01); *H04R 3/02* (2013.01); *H04R 29/001* (2013.01); *G10L 2021/02082* (2013.01); *H04R 2499/11* (2013.01); *H04R 2499/13* (2013.01)

(58) Field of Classification Search
USPC ... 381/59, 110, 104, 107, 26, 56, 58, 74, 96, 381/106, 162, 166, 17, 315, 386, 65, 66
See application file for complete search history.

(56) References Cited

U.S. PATENT DOCUMENTS

2014/0135078 A1\* 5/2014 Nigam ..................... H03G 3/00
455/570
2014/0254825 A1\* 9/2014 Tahernezhadi ........... H04R 3/02
381/93

\* cited by examiner

NONLINEAR ACOUSTIC ECHO CANCELLATION BASED ON TRANSDUCER IMPEDANCE

FIELD OF THE DISCLOSURE

The instant disclosure relates to speakers for mobile devices. More specifically, portions of this disclosure relate to echo cancellation using these speakers.

BACKGROUND

The sound from a loudspeaker can be reflected or coupled back to a microphone after some finite delay, producing an echo. Many modern audio devices include circuits known as acoustic echo cancelers, for reducing or eliminating the effects of such echoes. In an ideal case, the echo corresponds to the electrical signal causing the loudspeaker to generate the sound and the audio device (including loudspeaker, enclosure, and microphone) may be assumed to have a linear response to such electrical signal. However, in reality, most audio transducers, such as microphones and loudspeakers, and components used in devices including microphones and loudspeakers (e.g., power amplifiers used to drive loudspeakers) are nonlinear, even when operated in their optimum operating ranges.

These nonlinear effects may significantly reduce the performance of acoustic echo cancelers, particularly in mobile phones and hands-free kits for mobile phones, as such devices may often use inexpensive, low-quality loudspeakers that may be poorly isolated from the remainder of the audio device. When such a loudspeaker is overdriven, saturation effects associated with the loudspeaker and its amplifier distort sound in a nonlinear manner. An acoustic echo of such sound contains a mixture of linear and nonlinear components. A typical acoustic echo canceler estimates only the linear acoustic impulse response of the loudspeaker-enclosure-microphone system. The remaining nonlinear components can be large and audible, particularly at high volumes.

Shortcomings mentioned here are only representative and are included simply to highlight that a need exists for improved electrical components, particularly for echo cancellation employed in consumer-level devices, such as mobile phones. Embodiments described herein address certain shortcomings but not necessarily each and every one described here or known in the art.

SUMMARY

In accordance with the teachings of the present disclosure, the disadvantages and problems associated with audio transducer nonlinearities in performing echo cancellation in an audio device may be reduced or eliminated. An acoustic echo cancellation system within an audio playback system of an electronic device, such as a mobile phone, may calculate an estimation of an acoustic echo based on parameters describing the transducer reproducing the audio playback signals. Those parameters may include, for example, a resistance and/or inductance of the transducer and a current through and/or a voltage across the transducer. In one example, the acoustic echo cancellation system may predict a coil velocity of the transducer based on the transducer impedance. Then, an echo may be estimated using the predicted coil velocity. That estimated echo may be used to predict nonlinearities in the transducer output and an appropriate signal generated to cancel nonlinear behavior. Echo signals are generally not directly correlated with the played back audio due to unique characteristics, such as nonlinear response, of the transducer. The estimated echo based on the predicted coil velocity may thus improve the quality of adaptive noise cancellation (ANC) provided by an electronic device. Further, using a limited number of input quantities, such as the impedance, current, and voltage, may reduce processing complexity, which results in a reduction of the complexity of the processing circuitry for acoustic echo cancellation (AEC) or adaptive noise cancellation (ANC).

According to one embodiment, an apparatus may include a current input node for receiving a current signal that is indicative of a current input signal into an audio speaker; a voltage input node for receiving a voltage signal that is indicative of a voltage value measured across the audio speaker; and/or a processing circuit coupled to the current input node and to the voltage input node. The processing circuit may be configured to perform the steps of calculating an impedance of the audio speaker based, at least in part, on the current signal received at the current input node and the voltage signal received at the voltage input node by using an adaptive filter; and/or generating an acoustic echo cancellation signal based, at least in part, on the calculated impedance of the audio speaker.

In some embodiments, the processing circuit may be configured to generate the acoustic echo cancellation signal to cancel a nonlinear response of the audio speaker; the processing circuit may be configured to generate the acoustic echo cancellation signal by performing the step of calculating a back electromagnetic force (bemf) of the audio speaker; the processing circuit may be configured to generate the acoustic echo cancellation signal by also performing the step of calculating a predicted coil velocity associated with the audio speaker based, at least in part, on the calculated back electromagnetic force (bemf), wherein the generated acoustic echo cancellation signal cancels a nonlinear response of the audio speaker when the audio speaker is nonlinear; the processing circuit may be configured to perform the step of calculating the predicted coil velocity without integrating a coil position; the processing circuit may be configured to perform the step of calculating an inductance of the audio speaker based, at least in part, on the current signal received at the current input node and the voltage signal received at the voltage input node; the processing circuit may be configured to perform the step of calculating the impedance of the audio speaker using the adaptive filter by applying the voltage signal as an input to the adaptive filter and applying the current signal to the adaptive filter as a reference input; and/or the processing circuit may be configured to perform the step of calculating the impedance of the audio speaker by also summing a plurality of coefficients generated by the adaptive filter to calculate a resistance of the audio speaker, wherein the processing circuit is configured to generate the acoustic echo cancellation signal based on the calculated resistance.

According to another embodiment, a method may include the steps of receiving a current signal that is indicative of a current input signal into an audio speaker; receiving a voltage signal that is indicative of a voltage value measured across the audio speaker; calculating an impedance of the audio speaker based, at least in part, on the current signal and the voltage signal by using an adaptive filter; and/or generating an acoustic echo cancellation signal based, at least in part, on the calculated impedance of the audio speaker.

In certain embodiments of the method, the step of generating the acoustic echo cancellation signal may cancel a nonlinear response of the audio speaker; the step of generating the acoustic echo cancellation signal may include performing the step of calculating a back electromagnetic force (bemf) of the audio speaker; the step of generating the acoustic echo cancellation signal may include calculating a predicted coil velocity associated with the audio speaker based, at least in part, on the calculated back electromagnetic force (bemf), wherein the generated acoustic echo cancellation signal cancels a nonlinear response of the audio speaker when the audio speaker is nonlinear; the step of calculating the predicted coil velocity may be performed without integrating a coil position; the step of calculating an inductance of the audio speaker may be based, at least in part, on the current signal received at the current input node and the voltage signal received at the voltage input node; the step of calculating the impedance of the audio speaker using the adaptive filter may include applying the voltage signal as an input to the adaptive filter and applying the current signal to the adaptive filter as a reference input; the step of calculating the impedance of the audio speaker may include the step of calculating a resistance of the audio speaker using the adaptive filter by summing a plurality of coefficients generated by the adaptive filter, and wherein the step of generating an acoustic echo cancellation signal is based on the calculated resistance; and/or the steps of receiving the current signal, receiving the voltage signal, calculating the impedance of the audio speaker, and generating the acoustic echo cancellation signal may be repeated during playback of audio on a mobile electronics device.

According to yet another embodiment, a system for acoustic echo cancellation may include a current input node for receiving a current signal that is indicative of a current input signal into an audio speaker; a voltage input node for receiving a voltage signal that is indicative of a voltage value measured across the audio speaker; an impedance calculation module coupled to the current input node and the voltage input node, wherein the impedance calculation module is configured to calculate an impedance of the audio speaker based, at least in part, on the current signal received at the current input node and the voltage signal received at the voltage input node by using an adaptive filter; a back electromagnetic force (bemf) calculation module coupled to the current input node, coupled to the voltage input node, and coupled to the impedance calculation module, wherein the back electromagnetic force (bemf) calculation module is configured to generate a back electromagnetic force (bemf) signal based, at least in part, on the calculated impedance of the audio speaker received from the impedance calculation module; and/or a velocity acoustic impulse response (AIR) calculation module coupled to the back electromagnetic force (bemf) calculation module, wherein the AIR calculation module is configured to generate an acoustic echo cancellation signal based, at least in part, on the back electromagnetic force (bemf) signal received from the back electromagnetic force (bemf) calculation module. The system may be integrated into a mobile electronic device with the audio speaker.

In some embodiments, the impedance calculation module of the acoustic echo cancellation system may include an adaptive filter module configured to receive the voltage signal as an input and to receive the current signal as a reference input, wherein the adaptive filter module is configured to generate a plurality of coefficients; and/or a summation module coupled to the adaptive filter module, wherein the summation module is configured to sum the plurality of coefficients to calculate a resistance of the audio speaker, wherein the AIR calculation module is configured to generate an acoustic echo cancellation signal based on the calculated resistance.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Acoustic echo cancellation may be performed based on an impedance of the transducer producing the audio output, such as a speaker in a mobile phone. A speaker of a mobile phone is driven by a current $i(n)$ produced by an amplifier. That current $i(n)$ creates a voltage $v(n)$ differential at the speaker. The current $i(n)$ through the speaker may be monitored, along with the voltage $v(n)$ across the speaker. By correlating the current $i(n)$ signal and the voltage $v(n)$ signal at approximately the same time t, an impedance of the speaker may be determined and an acoustic echo cancellation signal produced. A block diagram of a system for producing the acoustic echo cancellation signal is shown in FIG. 1.

Figure 1:
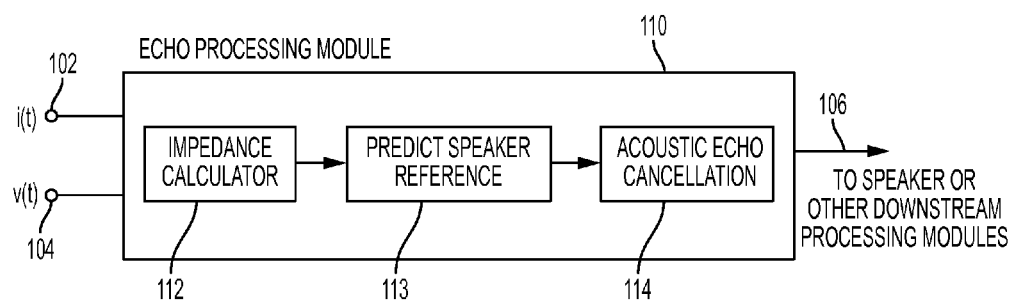
FIG. 1 is an example block diagram illustrating an adaptive echo cancellation (AEC) processing circuit with impedance calculation according to one embodiment of the disclosure.

FIG. 1 is an example block diagram illustrating an adaptive echo cancellation (AEC) processing circuit with impedance calculation according to one embodiment of the disclosure. An AEC processing circuit 110 may thus receive from a current input node 102 the current signal i(n) and receive from a voltage input node 104 the voltage signal v(n). An impedance calculator 112 of the AEC processing circuit 110 may process the signals received at input nodes 102 and 104 to produce an impedance value. That impedance value may be provided to a speaker prediction module 113, and then to an acoustic echo cancellation module 114, which generates an output signal that may be provided via output 106 to further AEC processing circuitry, which uses the signal to cancel non-linear echoes produced by the speaker. In one embodiment, the acoustic echo cancellation module 114 may produce an estimated echo $q_{est}(n)$ using the calculated impedance. That estimated echo $q_{est}(n)$ may be output to other AEC processing modules and used to adapt an adaptive echo cancellation algorithm.

Figure 2:
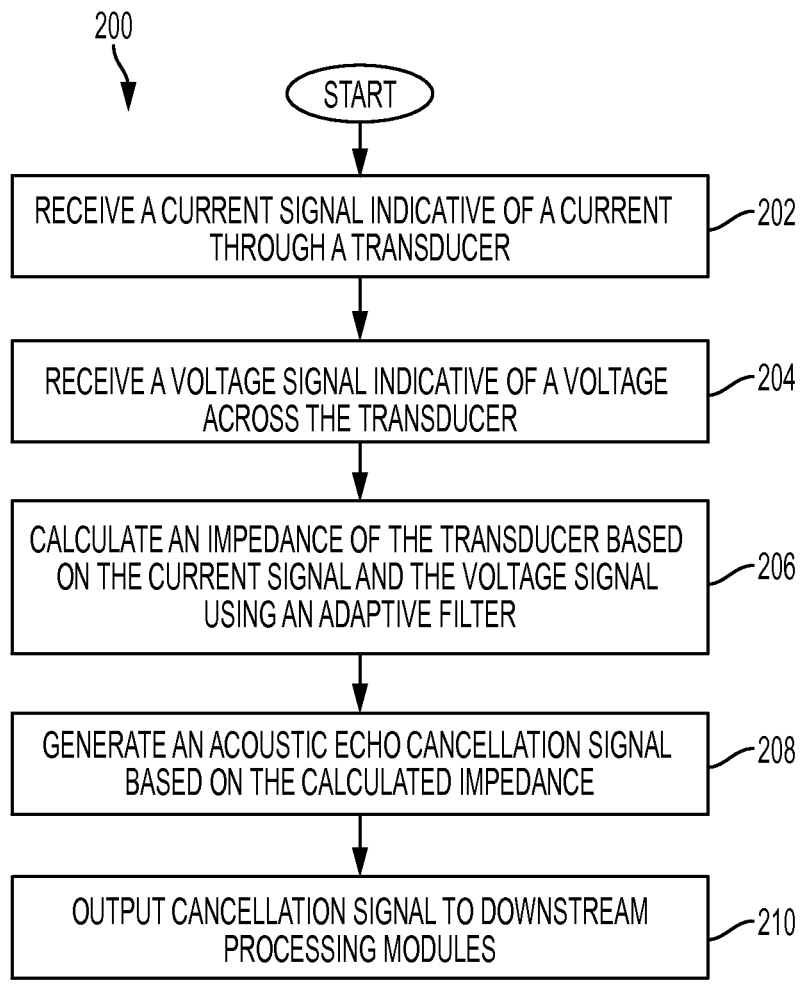
FIG. 2 is an example flow chart illustrating a method of generating an acoustic echo cancellation signal based on speaker impedance according to one embodiment of the disclosure.

The method performed by the AEC processing circuit is shown in further detail in FIG. 2. FIG. 2 is an example flow chart illustrating a method of generating an acoustic echo cancellation signal based on speaker impedance according to one embodiment of the disclosure. A method 200 begins at block 202 with receiving a current i(n) signal indicative of a current through a transducer. The current i(n) signal may be received through the input node 102 of FIG. 1. The method 200 continues to block 204 with receiving a voltage v(n) signal indicative of a voltage across the transducer. The voltage v(n) signal may be received through the input node 104 of FIG. 1. At block 206, an impedance of the transducer is calculated based on the voltage v(n) and current i(n) signals received at blocks 202 and 204. The calculation may be performed by the impedance calculator 112 of FIG. 1. In one embodiment, the impedance calculation is performed using an adaptive filter by applying the voltage v(n) signal as an input to the adaptive filter and applying the current i(n) signal to the adaptive filter as a reference input and/or summing a plurality of coefficients generated by the adaptive filter to calculate a resistance of the audio speaker.

Then, at block 208, an acoustic echo cancellation signal may be generated based on the calculated impedance of block 206. The acoustic echo cancellation signal may be produced by the cancellation module 114 of FIG. 1. In certain embodiments, the acoustic echo cancellation signal may be generated by performing steps including calculating a back electromagnetic force (bemf) of the audio speaker and/or calculating a predicted coil velocity associated with the audio speaker based, at least in part, on the calculated back electromagnetic force (bemf). Then, at block 210, the acoustic echo cancellation signal may be output to an AEC or other circuitry and used to cancel non-linear echoes produced by a speaker and/or amplifier.

Figure 3:
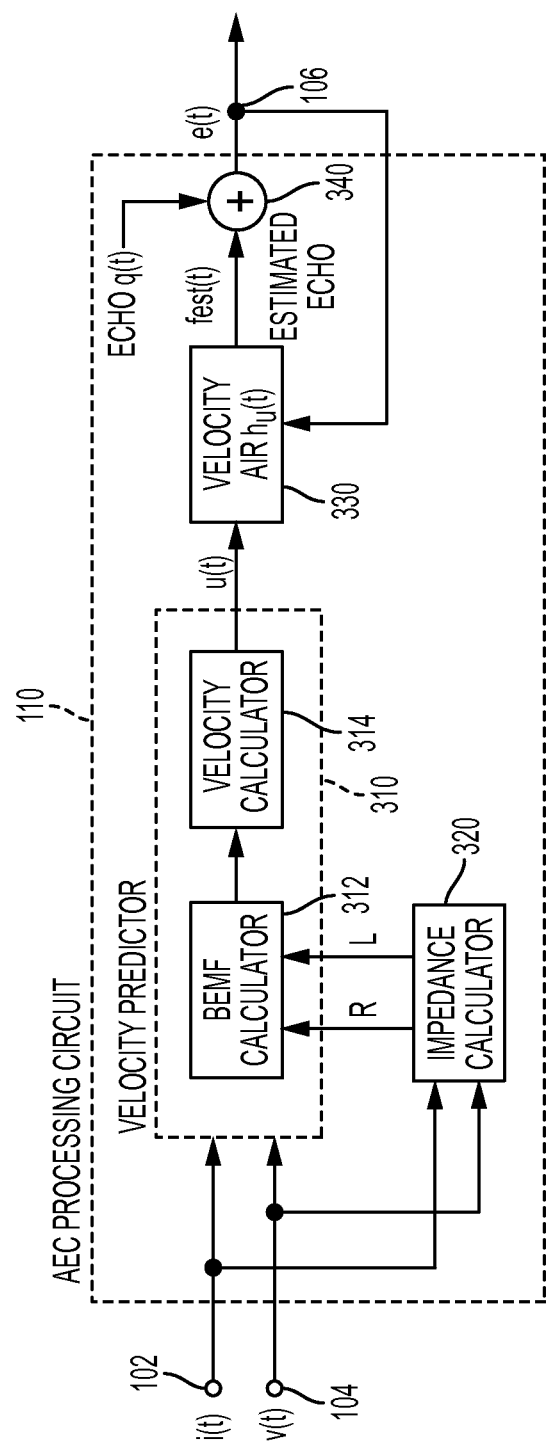
FIG. 3 is an example block diagram illustrating a system for echo cancellation using coil velocity predictions according to one embodiment of the disclosure.

One example embodiment of the illustrated AEC processing circuit 110 of FIG. 1 is shown in further detail in FIG. 3. FIG. 3 is an example block diagram illustrating a system for echo cancellation using coil velocity predictions according to one embodiment of the disclosure. The AEC processing circuit 110 may include impedance calculator 320 and velocity predictor 310, which both receive the current i(n) and voltage v(n) signals from input nodes 102 and 104, respectively. The impedance calculator 320 may generate a resistance R value and/or an inductance L value. One embodiment of the impedance calculator 320 is shown in FIG. 4.

Figure 4:
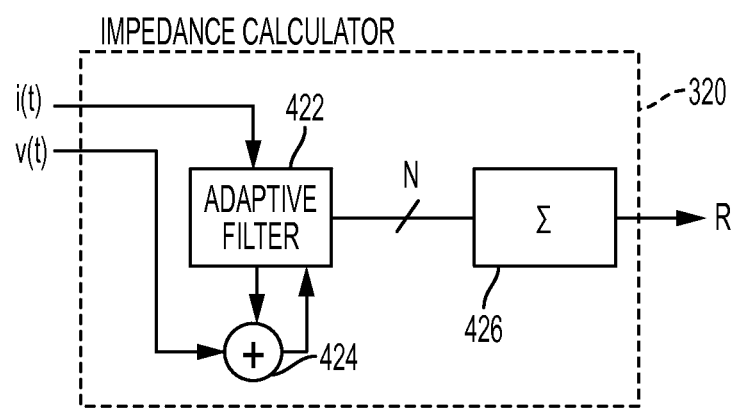
FIG. 4 is an example block diagram illustrating an adaptive filter-based impedance calculator for a transducer according to one embodiment of the disclosure.

FIG. 4 is an example block diagram illustrating an adaptive filter-based impedance calculator for a transducer according to one embodiment of the disclosure. The impedance calculator 320 of FIG. 4 may include adaptive filter 422 and combiner 424. The current i(n) signal may be provided to the adaptive filter 422 as a reference signal for the adaptive filter. The voltage v(n) signal may be provided to the adaptive filter 422 through the combiner 424, which combines the voltage v(n) signal with an output of the adaptive filter 422. The coefficients of the adaptive filter 422 may be output as N coefficients to a summation module 426, which sums the coefficients to generate a resistance R value. That resistance R value may be provided to the velocity predictor 310 of FIG. 3 and processed as described in further detail below. Although only the calculation of resistance R value is shown, an inductance L value may be similarly calculated or calculated according to another known methods or a predetermined value may be used.

Referring back to FIG. 3, the velocity predictor 310 may process the current i(n), voltage v(n), R, and/or L signals to produce a predicted cone velocity u(t) of the transducer. In one embodiment, the velocity u(t) may be predicted by calculating a back electromotive force bemf(t) for the transducer in BEMF calculator 312 and processing the bemf(t) signal in velocity calculator 310. After the velocity u(t) is generated by the velocity predictor 310, the velocity may be input to velocity acoustic impulse response (AIR) calculator 330 to calculate an estimated echo $q_{est}(t)$. That estimated echo $q_{est}(t)$ may be combined at combiner 340 with the actual echo q(t) received by a microphone. The actual echo q(t) is the echo resulting from playback of an audio signal through a speaker, wherein a portion of that playback audio, which may be a telephone conversation or sound effects or music, may be received by a microphone. When that microphone signal is played back, an echo is created by the echo signal q(t). By predicting the coil velocity u(t) of the speaker, the echo can be estimated as $q_{est}(t)$ and used to cancel out the echo q(t). The combination of estimated echo $q_{est}(t)$ with echo q(t) at combiner 340 produces an error signal e(t) that is used as feedback to the velocity AIR calculator 330. The error signal e(t), which may be referred to as the residual echo is what is left after echo cancellation. When AEC is functioning correctly, the residual echo e(t) is smaller than the original echo q(t). This residual echo plus the near-end speech may be transmitted to the other end called the far-end.

Figure 5:
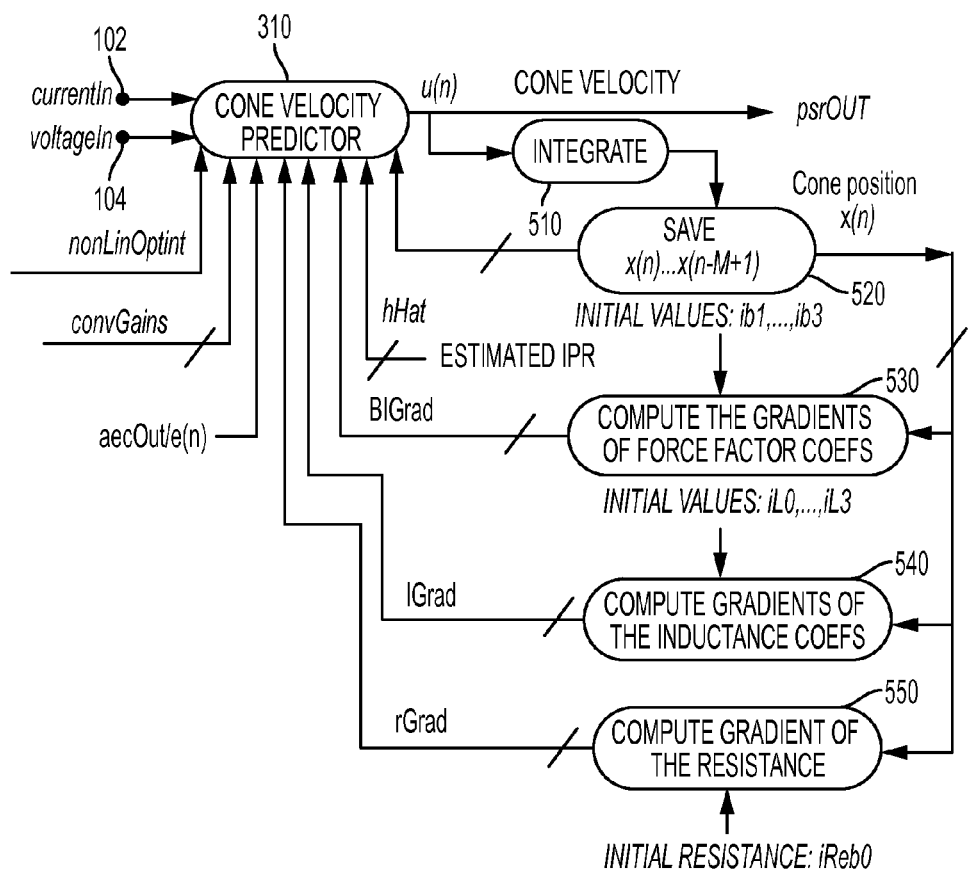
FIG. 5 is an example block diagram illustrating a cone velocity predictor according to one embodiment of the disclosure.

One example embodiment of the velocity predictor 310 is shown in further detail in FIG. 5. FIG. 5 is an example block diagram illustrating a cone velocity predictor according to one embodiment of the disclosure. FIG. 5 shows a top-level architecture of a predicted speaker reference (PSR) using a robust optimization and parameter estimation (ROPE) algorithm based on gradient descent. The PSR block uses estimates of a loudspeaker's coil inductance L and/or resistance R and the force factor parameters Bl(x) from the measured current i(n) and voltage v(n) and uses them to predict the loudspeaker's acoustic output. The loudspeaker's coil inductance L and resistance R values may be obtained from a separate block, such as the impedance calculator illustrated in FIG. 4 or may be generated within the cone velocity predictor. The predicted loudspeaker output may then be used as the reference for linear acoustic echo cancellation (AEC). For low frequencies, a loudspeaker's acoustic output may be proportional to the coil acceleration.

This predictor 310 may output the cone velocity u(n), and acceleration may be calculated based on a time derivative of that cone velocity u(n). By using both the current and voltage, only a few loudspeaker parameters are needed to predict its output. The PSR block combines the loudspeaker's coil current, voltage, inductance, and/or resistance to compute the induced back EMF (bemf) due to the coil velocity. The coil velocity u(n) is then computed by dividing the back EMF by the force factor Bl(n).

The loudspeaker's actual output may be measured by the device's voice microphone. The PSR block may use a gradient descent algorithm and the measured and predicted loudspeaker outputs to estimate the coil inductance, coil resistance, and force factor coefficients. In one embodiment, the loudspeaker parameters may be updated once per frame, although other update rates may be configured. The parameters that may be used by the cone velocity predictor 310 are shown in Table 1. Of the parameters in Table 1, $L_e(x)$ is the inductance and $R_e$ is the resistance of the voice coil and the force factor Bl(x) is an electromechanical quantity. One or more of these quantities may be used as input to a ROPE algorithm executing within the cone velocity predictor 310. Because the computations described below directly calculate the cone velocity, no separate calculation or measurement of coil position is necessary and, further, no integration of that coil position is necessary.

Next, a cone displacement x(n) may be computed by integrating the cone velocity u(n) at block 510 using the following equation:
The x(n) values may be saved at block 520. Next, using the velocity u(n) as a reference, the echo impulse response may be updated using a normalized least mean square (NLMS) algorithm according to the following equations:

$$U(n) = \text{velocity vector} = [u(n)u(n-1), \ldots u(n-M+1)]^T,$$

$$E(n) = U^T(n)U(n) + \delta$$

where m is the length of the impulse response in samples, $\delta$ is the regularization factor and $\mu_h$ is the step size of the NLMS algorithm. Then, the force factor coefficients may be updated at block 530 using the gradient descent algorithm according to the following equation:

$$b_j(n) = b_j(n-1) + \mu_b(j)e(n) \sum_{k=iprPart(1)}^{k=iprPart(2)} h(k) \frac{u(n-k+1)}{Bl(x(n-k+1))E(n)} x^j(n-k+1), \quad j = 2, \ldots 4,$$

where $\mu_b(j)$ is the step size for updating the j-th force factor coefficient and e(n) is the acoustic echo cancellation (AEC)

TABLE 1

Definition of Loudspeaker Parameters

| Parameter | Description | Unit | Typical value |
|---|---|---|---|
| Bl(x) | Force factor (Newtons/Amp), here B is the magnetic field and l(x) is the length of the voice coil wire that is in the magnetic field (B) of the loudspeaker magnet. | Newtons/ Ampere | 0.80596 N/A |
| $L_e(x)$ | Electrical inductance as a function of coil displacement x | Henries | ~300 uH for midsize loudspeakers and 3 uH for micro-speakers |
| $R_e$ | Electrical resistance of the voice coil | Ohms | 7.2 Ohms |

One embodiment of the ROPE algorithm of the cone velocity predictor 310 may begin with computing the force factor Bl and the electrical inductance $L_e$ at time n from the following equations:

$$Bl(x(n-1)) = b_0 + b_1 x(n-1) + b_2 x^2(n-1) + b_3 x^3(n-1) + b_4 x^4(n-1) \text{ and}$$

$$L_e(x(n-1)) = l_0 + l_1 x(n-1) + l_2 x^2(n-1) + l_3 x^3(n-1) + l_4 x^4(n-1),$$

Although 4th order Taylor series are shown for calculating force factor Bl and electrical inductance $L_e$, other representations may be used in the calculations without affecting further processing in the ROPE algorithm. Because at time n the current position of the cone x (n) is not yet known, the values of the force factor Bl and inductance $L_e$ at the last position x(n−1) may be used instead. Next, the back EMF (bemf) may be calculated from the measured coil current i(n) and voltage v(n) and the coil inductance $L_e$ and resistance $R_e$ as follows:

$$\text{bemf}(n) = v(n) - R_e(n-1)i(n) - L_e(x(n-1))F_s(i(n) - i(n-1)),$$

where $F_s$ is the sampling frequency. Then, the coil velocity v(n) is computed from the back EMF (bemf) and the force factor Bl(x) from the following equation:

$$u(n) = \text{bemf}(n)/Bl(x(n-1)).$$

output that is generated by an AEC block. In some embodiments, only part of the linear impulse response h (n) may be used in the calculation. Next, the inductance coefficients may be updated at block 540 using the gradient decent algorithm according to the following equation:

$$l_j(n) = l_j(n-1) + \mu_l(j)e(n)F_s \sum_{k=iprPart(1)}^{k=iprPart(2)} h(k) \frac{i(n-k+1) - i(n-k)}{Bl(x(n-k+1))E(n)} x^j(n-k+1),$$

$$j = 2, \ldots 4,$$

where $F_s$ is the sampling frequency in Hz. Finally, the coil resistance may be updated at block 550 using the gradient decent algorithm according to the following equation:

$$R_e(n) = R_e(n-1) + \mu_R e(n) \sum_{k=iprPart(1)}^{k=iprPart(2)} h(k) \frac{i(n-k+1)}{Bl(x(n-k+1))E(n)}.$$

Alternatively, the resistance may be calculated using a normalized least means square (NLMS) algorithm, where resistance is the DC value of impedance, and the impedance is estimated using a NLMS filter with coil current as the reference and coil voltage as the desired signal.

$$e(n) = v(n) + \sum_{k=0}^{k=Rtaps} h_I(k)i(n-k)$$

$$h_I(n,k) = h_I(n-1,k) + \frac{\mu \cdot e(n) \cdot i(n-k)}{\sum_{k=0}^{k=Rtaps} i^2(n-k)}$$

$$R_e(n) = \sum_{k=0}^{k=Rtaps} h_I(n,k),$$

where $R_{taps}$ is the number of adaptive filter coefficients used for the calculation of resistance (such as 32 taps for a 16 kHz sampling frequency). To simply the algorithm and save processing power (e.g., MIPS), the signed LMS algorithm may be used and only its sign used instead of the value of the gradient.

The updates at blocks 530, 540, and 550 may be performed once every frame, such as at 4 ms intervals or at 32 sample intervals at 8 kHz. The ROPE algorithm described above when updated at these intervals results in a low processing burden on a DSP or other processor executing this algorithm. However, the updates may occur at other intervals, such as user-specified parameters for how often nonlinear optimization is performed. The AEC updates in the AEC block, such as module 114 of FIG. 1, may be performed on a sample-by-sample basis.

The AEC processing circuit 110 of FIG. 1 configured such as described in any of the embodiments illustrated in FIG. 3, FIG. 4, and/or FIG. 5 may be incorporated into an electronic device. For example, the AEC processing circuit 110 may be included in a speaker phone, a hands-free audio device, a mobile phone, a tablet computer, a personal computer, an entertainment device, a remote control, a set-top box, or a voice recorder. Some example devices that include this AEC functionality are illustrated further in FIG. 6, FIG. 7, and FIG. 8.

Figure 6:
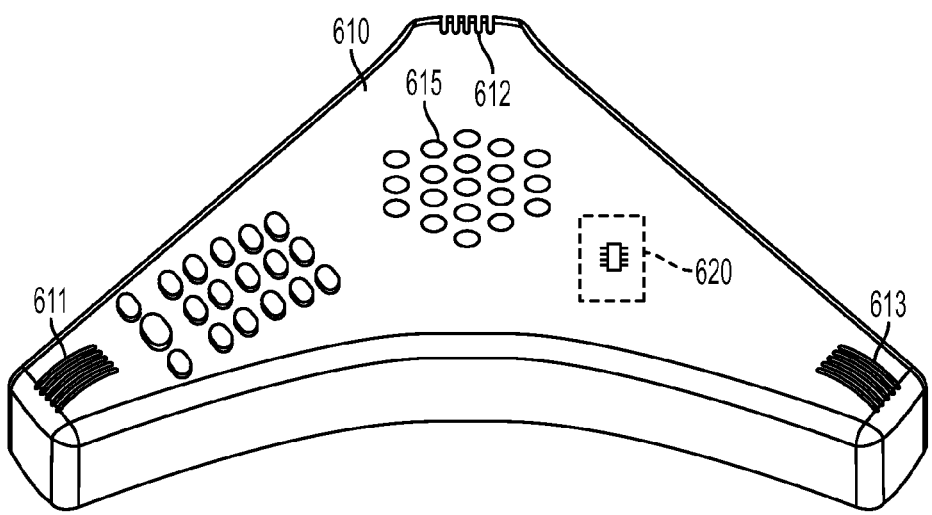
FIG. 6 is an illustration showing a speakerphone with echo cancellation according to one embodiment of the disclosure.

FIG. 6 is an illustration showing a speakerphone with echo cancellation according to one embodiment of the disclosure. A communication device 610 may include an echo cancellation system that may implement embodiments of the present disclosure. The communication device 610 may be a conference phone or speakerphone, such as those found in business offices, homes, cars, and other locations. The communication device 610 may include a plurality of microphones 611, 612, and 613, and a speaker 615 in a sculptured case. A processor 620, such as a digital signal processor (DSP) or audio codec, may be contained within the sculptured case and include hardware, firmware, and/or software for performing the algorithms described above regarding impedance calculation, cone velocity prediction, bemf calculation, and/or echo cancellation. The processor 620 may be coupled to the microphones 611, 612, and/or 613, and the speaker 615. By performing echo cancellation, the processor 620 can improve the quality of audio transmitted to the far-end.

Figure 7:
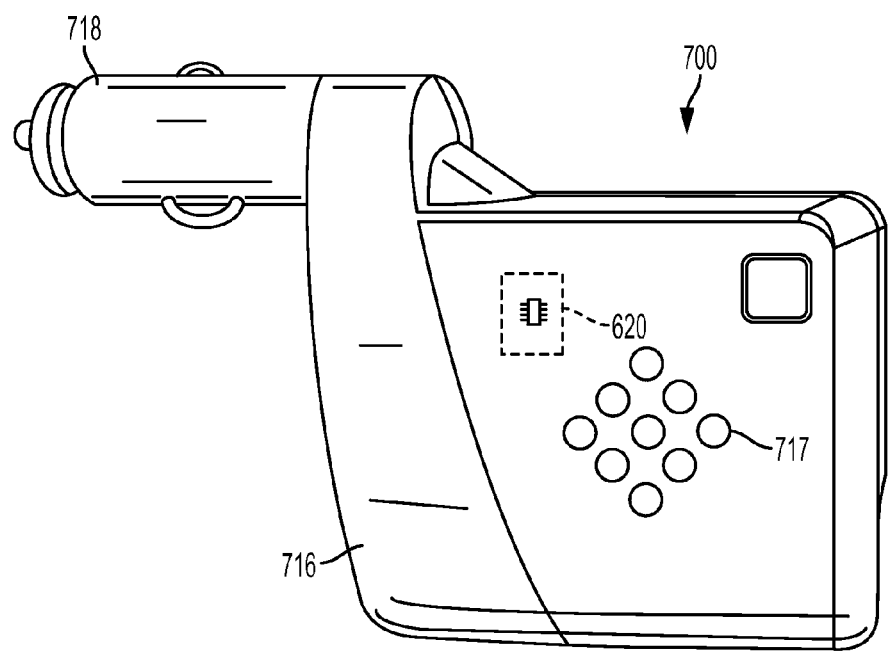
FIG. 7 is an illustration showing a hands-free kit with echo cancellation according to one embodiment of the disclosure.

FIG. 7 is an illustration showing a hands-free kit with echo cancellation according to one embodiment of the disclosure. A hands-free kit 700 may include an echo cancellation system that may implement embodiments of the present disclosure. The hands-free kit 700 may provide audio coupling to a cellular telephone, such as a mobile phone. Hands-free kits may come in a variety of implementations but generally include a case 716, a powered speaker 717 and a plug 718, which may couple to an accessory electrical power outlet or a cigarette lighter socket in a vehicle. The case 716 may include more than one microphone or one of the microphones (not shown) may be separate from and may plug into the case 716. The external microphone may be for placement as close to a user as possible, such as when clipped to a visor in a vehicle. The hands-free kit 700 may also include a cable for connection to a cellular telephone or have a wireless connection, such as a BLUETOOTH® interface for connecting to the cellular telephone. A hands-free kit in the form of a headset may be powered by internal batteries but may be electrically similar to the apparatus illustrated in FIG. 7. The hands-free kit 700 may also include the processor 620 for executing the algorithms disclosed in embodiments of the present disclosure to produce output audio signals for the speaker 717.

Figure 8:
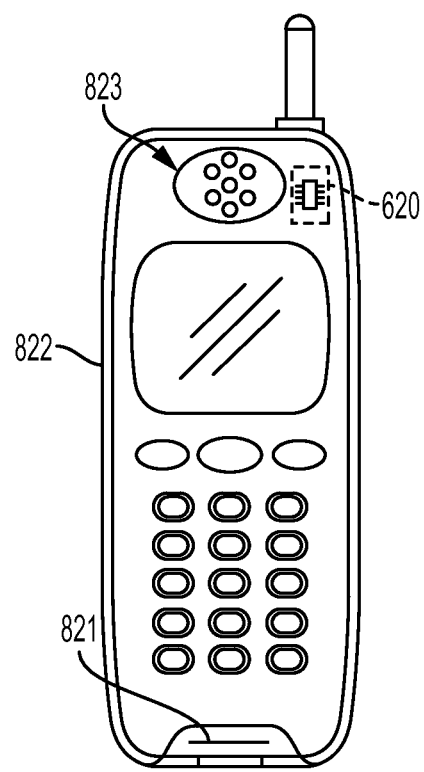
FIG. 8 is an illustration showing a mobile telephone with echo cancellation according to one embodiment of the disclosure.

FIG. 8 is an illustration showing a mobile telephone with echo cancellation according to one embodiment of the disclosure. A mobile telephone 822 may be sold in a variety of implementations but generally includes a microphone 821 for capturing sounds, such as the voice of a user, and a powered speaker 823 for generating sounds. The mobile telephone 822 may also include the processor 620 for executing the algorithms disclosed in embodiments of the present disclosure to produce output audio signals for the speaker 823. In addition to those devices disclosed above, the systems and methods herein may also be used with and applied to computers, smart phones, tablets, and/or any other device that may be used as a communication device.

The schematic flow chart diagram of FIG. 2 and FIG. 5 are generally set forth as a logical flow chart diagram. As such, the depicted order and labeled steps are indicative of aspects of the disclosed method. Other steps and methods may be conceived that are equivalent in function, logic, or effect to one or more steps, or portions thereof, of the illustrated method. Additionally, the format and symbols employed are provided to explain the logical steps of the method and are understood not to limit the scope of the method. Although various arrow types and line types may be employed in the flow chart diagram, they are understood not to limit the scope of the corresponding method. Indeed, some arrows or other connectors may be used to indicate only the logical flow of the method. For instance, an arrow may indicate a waiting or monitoring period of unspecified duration between enumerated steps of the depicted method. Additionally, the order in which a particular method occurs may or may not strictly adhere to the order of the corresponding steps shown.

If implemented in firmware and/or software, functions described above may be stored as one or more instructions or code on a computer-readable medium Examples include non-transitory computer-readable media encoded with a data structure and computer-readable media encoded with a computer program. Computer-readable media includes physical computer storage media. A storage medium may be any available medium that can be accessed by a computer. By way of example, and not limitation, such computer-readable media can comprise random access memory (RAM), read-only memory (ROM), electrically-erasable programmable read-only memory (EEPROM), compact disc read-only memory (CD-ROM) or other optical disk storage, magnetic disk storage or other magnetic storage devices, or any other medium that can be used to store desired program code in the form of instructions or data structures and that can be accessed by a computer. Disk and disc includes compact discs (CD), laser discs, optical discs, digital versatile discs (DVD), floppy disks and Blu-ray discs. Generally, disks reproduce data magnetically, and discs reproduce data optically. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An apparatus, comprising:
 a current input node for receiving a current signal that is indicative of a measured current into an audio speaker;
 a voltage input node for receiving a voltage signal that is indicative of a voltage value measured across the audio speaker; and
 a processing circuit coupled to the current input node and to the voltage input node and configured to perform the steps of:
  calculating an impedance of the audio speaker based, at least in part, on the current signal received at the current input node and the voltage signal received at the voltage input node by using an adaptive filter; and
  generating an acoustic echo cancellation signal based, at least in part, on the calculated impedance of the audio speaker.

2. The apparatus of claim 1, wherein the processing circuit is configured to generate the acoustic echo cancellation signal to cancel a nonlinear response of the audio speaker.

3. The apparatus of claim 1, wherein the processing circuit is configured to generate the acoustic echo cancellation signal by performing the step of calculating a back electromagnetic force (bemf) of the audio speaker.

4. The apparatus of claim 3, wherein the processing circuit is configured to generate the acoustic echo cancellation signal by also performing the step of calculating a predicted coil velocity associated with the audio speaker based, at least in part, on the calculated back electromagnetic force (bemf), wherein the generated acoustic echo cancellation signal cancels a nonlinear response of the audio speaker when the audio speaker is nonlinear.

5. The apparatus of claim 4, wherein the processing circuit is configured to perform the step of calculating the predicted coil velocity without integrating a coil position.

6. The apparatus of claim 1, wherein the processing circuit is further configured to perform the step of calculating an inductance of the audio speaker based, at least in part, on the current signal received at the current input node and the voltage signal received at the voltage input node.

7. The apparatus of claim 1, wherein the processing circuit is configured to perform the step of calculating the impedance of the audio speaker using the adaptive filter by applying the voltage signal as an input to the adaptive filter and applying the current signal to the adaptive filter as a reference input.

8. The apparatus of claim 7, wherein the processing circuit is configured to perform the step of calculating the impedance of the audio speaker by also summing a plurality of coefficients generated by the adaptive filter to calculate a resistance of the audio speaker, wherein the processing circuit is configured to generate the acoustic echo cancellation based on the calculated resistance.

9. The apparatus of claim 1, wherein the processing circuit comprises:
 a speaker reference prediction module configured to receive the impedance of the speaker and to calculate a parameter associated with the audio speaker; and
 an acoustic echo cancellation module configured to receive the calculated parameter from the speaker reference prediction module and to generate the acoustic echo cancellation signal based, at least in part, on the calculated parameter.

10. The apparatus of claim 9, wherein the processing circuit is configured to transmit the acoustic echo cancellation signal to downstream processing modules.

11. A method, comprising:
 receiving a current signal that is indicative of a current input signal into an audio speaker;
 receiving a voltage signal that is indicative of a voltage value measured across the audio speaker;
 calculating an impedance of the audio speaker based, at least in part, on the current signal and the voltage signal by using an adaptive filter; and
 generating an acoustic echo cancellation signal based, at least in part, on the calculated impedance of the audio speaker.

12. The method of claim 11, wherein the step of generating the acoustic echo cancellation signal cancels a nonlinear response of the audio speaker.

13. The method of claim 11, wherein the step of generating the acoustic echo cancellation signal comprises performing the step of calculating a back electromagnetic force (bemf) of the audio speaker.

14. The method of claim 13, wherein the step of generating the acoustic echo cancellation signal comprises calculating a predicted coil velocity associated with the audio speaker based, at least in part, on the calculated back electromagnetic force (bemf), wherein the generated acoustic echo cancellation signal cancels a nonlinear response of the audio speaker when the audio speaker is nonlinear.

15. The method of claim 14, wherein the step of calculating the predicted coil velocity is performed without integrating a coil position.

16. The method of claim 11, further comprising the step of calculating an inductance of the audio speaker is based, at least in part, on the current signal received at the current input node and the voltage signal received at the voltage input node.

17. The method of claim 11, wherein the step of calculating the impedance of the audio speaker using the adaptive filter comprises applying the voltage signal as an input to the adaptive filter and applying the current signal to the adaptive filter as a reference input.

18. The method of claim 17, wherein the step of calculating the impedance of the audio speaker comprises the step of calculating a resistance of the audio speaker using the adaptive filter by summing a plurality of coefficients generated by the adaptive filter, and wherein the step of generating an acoustic echo cancellation signal is based on the calculated resistance.

19. The method of claim 11, wherein the steps of receiving the current signal, receiving the voltage signal, calculating the impedance of the audio speaker, and generating the acoustic echo cancellation signal are repeated during playback of audio on a mobile electronics device.

20. The method of claim 11, wherein the step of generating the acoustic echo cancellation signal comprises calculating a parameter associated with the audio speaker, and wherein the acoustic echo cancellation signal is based, at least in part, on the calculated parameter associated with the audio speaker.

21. The method of claim 20, further comprising transmitting the acoustic echo cancellation signal to downstream processing modules.

22. A system for acoustic echo cancellation, comprising:
a current input node for receiving a current signal that is indicative of a current input signal into an audio speaker;
a voltage input node for receiving a voltage signal that is indicative of a voltage value measured across the audio speaker;
an impedance calculation module coupled to the current input node and the voltage input node, wherein the impedance calculation module is configured to calculate an impedance of the audio speaker based, at least in part, on the current signal received at the current input node and the voltage signal received at the voltage input node by using an adaptive filter;
a back electromagnetic force (bemf) calculation module coupled to the current input node, coupled to the voltage input node, and coupled to the impedance calculation module, wherein the back electromagnetic force (bemf) calculation module is configured to generate a back electromagnetic force (bemf) signal based, at least in part, on the calculated impedance of the audio speaker received from the impedance calculation module; and
a velocity acoustic impulse response (AIR) calculation module coupled to the back electromagnetic force (bemf) calculation module, wherein the AIR calculation module is configured to generate an acoustic echo cancellation signal based, at least in part, on the back electromagnetic force (bemf) signal received from the back electromagnetic force (bemf) calculation module.

23. The system of claim 22, wherein the impedance calculation module comprises:
an adaptive filter module configured to receive the voltage signal as an input and to receive the current signal as a reference input, wherein the adaptive filter module is configured to generate a plurality of coefficients; and
a summation module coupled to the adaptive filter module, wherein the summation module is configured to sum the plurality of coefficients to calculate a resistance of the audio speaker,
wherein the AIR calculation module is configured to generate an acoustic echo cancellation signal based on the calculated resistance.

24. The system of claim 22, wherein the system is integrated into a mobile electronic device with the audio speaker.

25. The system of claim 22, wherein the velocity acoustic impulse response (AIR) calculation module is configured to transmit the acoustic echo cancellation signal to downstream processing modules.

* * * * *